(12) United States Patent
Yang et al.

(10) Patent No.: US 8,812,939 B2
(45) Date of Patent: Aug. 19, 2014

(54) SOFT DECODING SYSTEMS AND METHODS FOR FLASH BASED MEMORY SYSTEMS

(75) Inventors: Xueshi Yang, Cupertino, CA (US); Gregory Burd, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 269 days.

(21) Appl. No.: 13/358,203

(22) Filed: Jan. 25, 2012

(65) Prior Publication Data

US 2012/0198314 A1    Aug. 2, 2012

Related U.S. Application Data

(60) Provisional application No. 61/437,518, filed on Jan. 28, 2011.

(51) Int. Cl.
*H03M 13/00* (2006.01)
*H03M 13/03* (2006.01)

(52) U.S. Cl.
USPC .......................................... 714/782; 714/795

(58) Field of Classification Search
CPC .......... H03M 13/152; H03M 13/2927; H03M 13/2957; H03M 13/377; H03M 13/3738; H03M 13/296; H03M 13/1102; H03M 13/15; H03M 13/23; H03M 13/2906; H03M 13/3707; H03M 13/41; H03M 13/51; H03M 13/6561; H04L 1/0053; H04L 1/20

USPC ......... 714/782, 781, 755, 786, 795, 746, 801, 714/791

See application file for complete search history.

(56) References Cited

U.S. PATENT DOCUMENTS

| | | | | |
|---|---|---|---|---|
| 5,381,145 | A * | 1/1995 | Allen et al. | 341/107 |
| 5,583,500 | A * | 12/1996 | Allen et al. | 341/107 |
| 6,658,605 | B1 * | 12/2003 | Yoshida et al. | 714/702 |
| 6,721,373 | B1 * | 4/2004 | Frenkel et al. | 375/346 |
| 7,823,043 | B2 * | 10/2010 | Lasser | 714/755 |
| 8,042,029 | B2 * | 10/2011 | Alrod et al. | 714/791 |
| 8,225,166 | B2 * | 7/2012 | Yang et al. | 714/752 |
| 2007/0283227 | A1 * | 12/2007 | Sharon et al. | 714/776 |
| 2010/0223534 | A1 * | 9/2010 | Earnshaw et al. | 714/780 |
| 2012/0119928 | A1 | 5/2012 | Yang | |
| 2013/0145229 | A1 * | 6/2013 | Frayer et al. | 714/755 |

* cited by examiner

*Primary Examiner* — Phung M Chung

(57) ABSTRACT

Systems and methods for decoding data using a decoder that includes a primary decoder and an auxiliary decoder are provided. A codeword is retrieved from a storage device. A primary decoder attempts to decode the codeword using hard data associated with the codeword. If the primary decoder fails, an indication of the failure may be received by a decoder controller, which activates an auxiliary decoder. The auxiliary decoder attempts to decode the codeword using either hard data or soft data associated with the codeword. The primary decoder is designed to consume less power, consume less silicon area, and have a higher throughput than the auxiliary decoder. The primary decoder is configured to have a higher probability of successfully decoding a codeword, stored in the storage device, in the first attempt to decode the codeword, than failing and requiring the auxiliary decoder to decode the codeword.

20 Claims, 5 Drawing Sheets

US 8,812,939 B2

SOFT DECODING SYSTEMS AND METHODS FOR FLASH BASED MEMORY SYSTEMS

CROSS REFERENCE TO RELATED APPLICATION

This disclosure claims the benefit of U.S. Provisional Application No. 61/437,518, filed Jan. 28, 2011, which is hereby incorporated by reference herein in its entirety.

FIELD OF USE

The present disclosure relates generally to communications and/or storage systems and methods, and more particularly, to systems and methods for decoding error correction codes.

BACKGROUND

The background description provided herein is for the purpose of generally presenting the context of the disclosure. Work of the inventors hereof, to the extent the work, is described in this background section, as well as aspects of the description that may not otherwise qualify as prior art at the time of filing, is neither expressly nor impliedly admitted as prior art against the present disclosure.

Data error rates in traditional flash memory devices depend on, the duration of time that the flash memory devices operate, the duration of time the data is retained in the memory, as well as the number of program-erase (PE) cycles of the page where the data resides and many other factors. For example, as the flash memory device operates, the reliability of the raw flash memory degrades significantly. In particular, raw bit error rates (BER) and signal to noise ratios (SNR) become worse during normal PE cycles and data retention duration decreases. In order to satisfy rigorous reliability requirements for data storage applications, a storage controller may be responsible for maintaining, throughout, the use of a storage device and regardless of the actual BER, similar or consistent corrected bit error rates (CBER), which are the error rates perceived by a user.

Traditional storage applications use error correction code circuitries (ECC) to encode stored data and decoding engines to detect/correct data errors encountered when reading the data from the flash memory storage devices. A storage application may employ increasingly stronger error correction encoding and decoding techniques in order to maintain similar or consistent CBER. For example, a storage application and/or a storage controller may employ low-density parity check (LDPC) coding techniques to achieve these goals. Such LDPC coding techniques involve the use of soft iterative decoding techniques, which involve the decoder making several iterations to decode stored encoded information. As used herein, encoded information can be grouped into units called "codewords." Codewords may contain "symbols," which are groupings of one or more bits.

Soft iterative decoding uses soft data associated with a stored codeword to decode the codeword. As used herein, soft data or information is data that indicate the probability that a symbol in the codeword is a particular data symbol, such as "0" or "1" in a binary system. In contrast to soft iterative decoding, hard decision decoding (equivalently hard data decoding) is based on hard data (i.e., hard decisions) associated with the stored, codeword. As used herein, hard, data, hard decisions consist of data corresponding to the original codeword symbols.

When traditional flash memory storage systems employ soft iterative decodable codes for storage applications, the complexity of the decoder may become substantially higher than when, for example, algebraic codes (such as BCH codes or Reed-Solomon codes) that require hard decision decoding using hard data. In addition when traditional flash memory storage systems employ soft iterative decodable codes for storage applications, the acquisition of soft data input (soft data about the stored codewords to be decoded) may be difficult to obtain (i.e., the soft, data may require a substantially long period of time to obtain and/or may consume a lot of power to obtain). This is because most flash storage is optimized to output hard decisions rather than soft data. Because of these difficulties in employing soft iterative decodable codes, the implementation of such codes for flash memory storage applications may not be highly desired due to the increased power usage and decreased throughput that may result in decoding such codes.

SUMMARY

Systems and methods are provided for achieving soft iterative decoding in storage systems using a hybrid decoding approach. In particular, the systems and methods for use with the systems achieve an appropriate balance between complexity (e.g., power consumption and silicon area used by the systems) and performance (e.g., throughput and signal-to-noise ratio gains).

In some embodiments, a codeword that is stored in a storage device is decoded using a storage system. The codeword is received from the storage device. A primary decoder of the decoder system attempts to decode the codeword. An indication that the primary decoder failed to decode the codeword is received. The codeword is decoded using an auxiliary decoder of the decoder system based on the received indication. The primary decoder is of a lower complexity than the auxiliary decoder. In an embodiment, the primary decoder has a higher throughput for decoding codewords than the auxiliary decoder. In an embodiment, the primary decoder consumes less power than the auxiliary decoder. In an embodiment, the auxiliary decoder is activated in response to receiving the indication that the primary decoder failed to decode the codeword.

In some embodiments, a decoder system, for decoding a codeword stored in a storage device, includes a primary decoder, a decoder controller, and an auxiliary decoder. The primary decoder is configured to attempt to decode the codeword. The decoder controller is configured to receive an indication that the primary decoder failed to decode the codeword. The auxiliary decoder is configured to decode the codeword based on the indication. The primary decoder is of a lower complexity than the auxiliary decoder. In an embodiment, the primary decoder takes up less silicon area than the auxiliary decoder. In an embodiment, the primary decoder includes a plurality of decoders that may operate in parallel. In an embodiment, the auxiliary decoder includes a plurality of decoders that may operate in parallel. In an embodiment, the decoder controller is configured to activate the auxiliary decoder in response to the indication that the primary decoder failed to decode the codeword.

BRIEF DESCRIPTION OF THE DRAWINGS

The above and other objects and advantages of the present disclosure will be apparent upon consideration of the following detailed description, taken in conjunction with the accompanying drawings, in which like reference characters refer to like parts throughout, and in which.

DETAILED DESCRIPTION

This disclosure generally relates to performing efficient decoding using a hybrid decoder. For illustrative purposes, this disclosure is described in the context of an electronic storage system where the storage used may be a flash memory device. However, it should be understood that the teachings of this disclosure are equally applicable to any other electronic storage system where the data that is written to the storage system is prone to reading errors (e.g., random access memory devices, programmable logic devices, non-volatile memory, volatile memory, FeRAM, CBRAM, PRAM, SONOS, RRAM, Racetrack memory, NRAM and Millipede storage devices).

Figure 1:
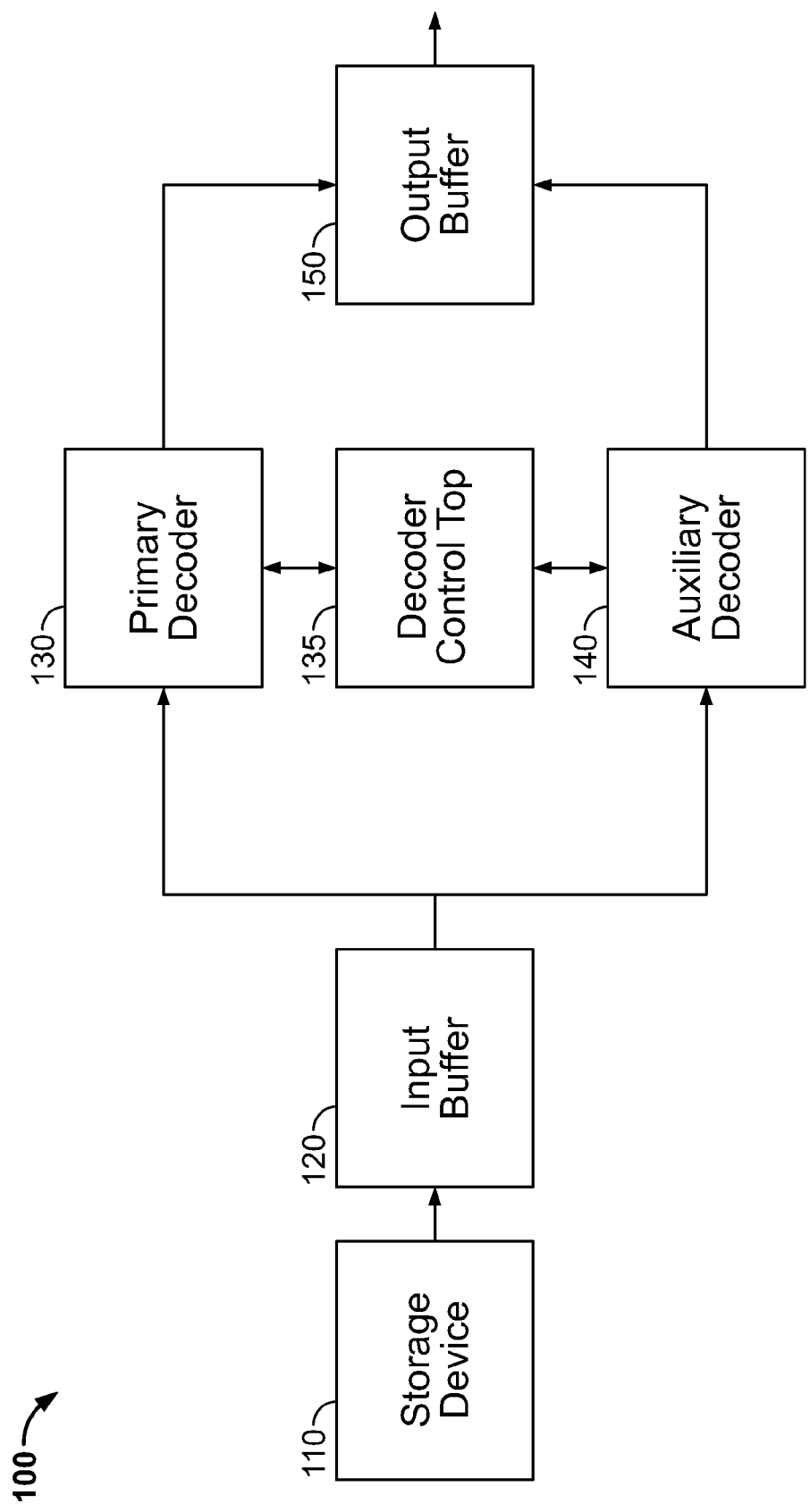
FIG. 1 shows an illustrative decoder system in accordance with some embodiments of the present disclosure.

FIG. 1 shows an illustrative system 100 in accordance with some embodiments of the present disclosure. System 100 includes a storage device 110, an input buffer 120, primary decoder circuitry 130, decoder control top 135, auxiliary decoder circuitry 140 and an output buffer 150. Primary decoder circuitry 130, decoder control top 135, and auxiliary decoder circuitry 140 may collectively be a decoder system. Storage device 110 may include an electronic storage device (e.g., flash memory device, random access memory devices, programmable logic devices, non-volatile memory, volatile memory, FeRAM, CBRAM, PRAM, SONOS, RRAM, Racetrack memory, and/or NRAM and Millipede storage devices).

The data stored in storage device 110 may be encoded and may thereby include a codeword. Storing the data in encoded form increases reliability in data that is stored in electronic memory. Once the codeword is retrieved from the memory, the codeword needs to be decoded to output the set of information represented by the codeword.

In some embodiments, a control circuit (not shown) may instruct storage device 110 to output data stored at a given address location. For example, the control circuit may instruct storage device 110 to retrieve a page of data. The codeword stored at the given address (or addresses) (e.g., the page of encoded data) is output, by storage device 110 and stored in input buffer 120. Input buffer 120 may be a temporary storage location in which a given set of codewords, which are retrieved from memory, are stored prior to being decoded.

Primary decoder 130 may read a codeword stored in input buffer 120. Primary decoder 130 may be a decoder that decodes the codeword in a very efficient manner. In particular, primary decoder 130 may use a smaller amount of power compared to auxiliary decoder 140, may use fewer iterations to decode a codeword compared to auxiliary decoder 140, and may be of a lower complexity than auxiliary decoder 140. Although primary decoder 130 may have lower error correction power than auxiliary decoder 140, the primary decoder may have a higher throughput (e.g., 25.6 Gbps) and may take up a lesser amount of silicon area than auxiliary decoder 140.

Primary decoder 130 may be one decoder. Primary decoder 130 may be more than one decoder, used individually or in combination, and used in series or in parallel. Primary decoder 130 may be a Viterbi decoder, an LDPC decoder, an AN decoder (a decoder used for decoding AN codes used for arithmetic applications, where A and N are integers), a BCH decoder, constant-weight decoder, convolutional decoder, or any other type of decoder of encoded information that makes use of hard data or soft data. In some implementations, primary decoder 130 may be coupled to storage device 110 and may be configured to retrieve, from the storage device, additional soft data input associated with the stored codewords (e.g., when decoder 130 is a decoder that uses soft data rather than hard data). In other implementations, decoder control top 135 may initiate a read operation from storage device 110 to read soft data and provide decoder 130 with that data. If primary decoder 130 succeeds in decoding the codeword it receives from input buffer 120, primary decoder 130 may output the decoded data to output buffer 150. Output buffer 150 may be a temporary storage location in which a decoded data set is stored for consumption by utilization circuitry (e.g., a processor or control circuitry).

If primary decoder 130 fails to decode the codeword from input buffer 120, decoder control top 135 may be notified of the failure. In some embodiments, decoder control top 135 may monitor primary decoder 130 to determine whether the codeword was successfully decoded. Decoder control top 135 may operate to activate auxiliary decoder 140. In some embodiments, decoder control top 135 may track the number of times that primary decoder 130 does not successfully decode a codeword and may declare that the primary decoder 130 failed to decode the codeword after a threshold number of such unsuccessful decoding attempts. In some embodiments, auxiliary decoder 140 may be activated (e.g., by decoder control top 135) when primary decoder 130 fails to successfully decode information. In some embodiments, auxiliary decoder 140 may be active, but may not attempt to decode the codeword from input buffer 120, until primary decoder 130 fails at decoding the codeword.

Auxiliary decoder 140 may read the codeword stored in input buffer 120. Auxiliary decoder 140 may be a decoder that decodes the codeword using a more powerful and more complex decoding technique. In particular, auxiliary decoder 140 may use a larger amount of power compared to primary decoder 130, may use more iterations to decode a codeword compared to primary decoder 130, and may be of a greater complexity than primary decoder 130. Although auxiliary decoder 140 may have increased error correction power than primary decoder 130, the auxiliary decoder may have a lower throughput (e.g., 800 Mbps) and may take up a greater amount of silicon area than primary decoder 130.

Auxiliary decoder 140 may be one decoder. Auxiliary decoder 140 may be more than one decoder, used individually or in combination, and used in series or in parallel. In some embodiments, auxiliary decoder 140 may be a Viterbi decoder, an LDPC decoder, an AN decoder (a decoder used for decoding AN codes used for arithmetic applications, where A and N are integers), a BCH decoder, constant-weight decoder, convolutional decoder, or any other type of decoder of encoded information that makes use of hard data or soft data. In some implementations, auxiliary decoder 140 may be coupled to storage device 110 and may be configured to retrieve, from the storage device, additional soft data input associated with the stored codewords (e.g., when decoder 140 is a decoder that uses soft data rather than hard data). In other implementations, decoder control top 135 may initiate a read operation from storage device 110 to read soft data and provide decoder 140 with that information. If auxiliary decoder 140 succeeds in decoding the codeword it receives from input buffer 120, auxiliary decoder 140 may output the decoded data 144 to output buffer 150. Output buffer 150 may be a temporary storage location in which a decoded data set is stored for consumption by utilization circuitry (e.g., a processor or control circuitry).

It should be understood that either one of decoders 130 and 140 may include circuitry that may implement any suitable decoding process or technique that is different from the technique from the other one of decoders 130 and 140. In some embodiments, decoders 130 and 140 may operate concurrently to decode a codeword. In some embodiments, decoder 140 may operate to decode a codeword before decoder 130. For example, if it is known that the codeword has a high BER or a low SNR, decoder 140 may operate to decode the codeword before decoder 130. Similarly use of techniques for decoding a codeword with a hybrid decoder are further described in co-pending, commonly assigned U.S. patent application Ser. No. 13/290,672, filed on Nov. 7, 2011, which is incorporated by reference herein in its entirety.

A codeword that has signal quality level (BER or SNR) that is worse than a second codeword may require a stronger, more complex, more time consuming, and more power consumptive decoder (e.g., a decoder, such as auxiliary decoder 140, that may decode information based on a soft data input and uses multiple iterations) to be successfully decoded than a decoder needed to decode the second codeword (e.g., a decoder, such as primary decoder 130, that may decode information based on a hard data input).

Figure 2:
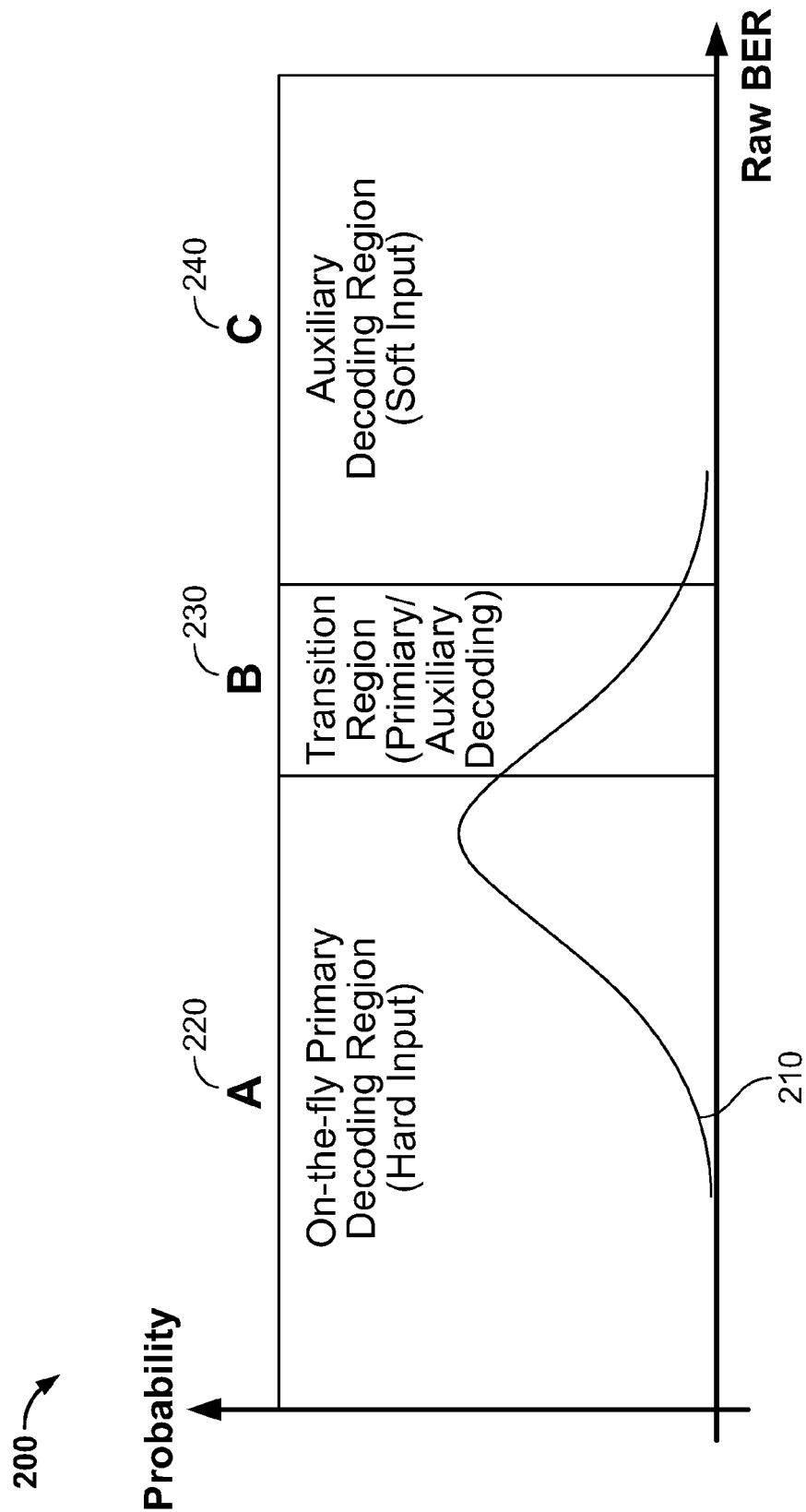
FIG. 2 shows an illustrative chart of decoding regions for decoder systems in accordance with some embodiments of the present disclosure.

FIG. 2 shows illustrative chart 200 of decoding regions for decoder systems in accordance with some embodiments of the present disclosure. Chart 200 includes curve 210, which shows the general probability distribution of the BERs of codewords stored in a storage device (e.g. storage device 110 of FIG. 1). In particular, curve 210 maps the raw bit error rate (x-axis) of a codeword that is read from a storage device to the probability (y-axis) that the codeword exhibits that raw bit error rate.

Chart 200 also shows three regions: on-the-fly primary decoding region 220 (where on-the-fly mode decoding is successful), transition (primary/auxiliary) decoding region 230 (where extended mode decoding is successful), and auxiliary decoding region 240 (where retry mode decoding is successful). Each of these regions/modes is an interval of the BERs of codewords over which a primary decoder (e.g., primary decoder 130 of FIG. 1) and/or an auxiliary decoder (e.g., auxiliary decoder 140 of FIG. 1) is able to successfully decode the codewords. In particular, for codewords with BERs in on-the-fly decoding region 220, a primary decoder (e.g., using hard data input) may be able to successfully decode the codeword (in on-the-fly mode decoding). For codewords with BERS in transition (primary/auxiliary) decoding region 230, although the on-the-fly mode decoding fails, either a primary or an auxiliary decoder (e.g., using hard data input) may be able to successfully decode the codewords (in extended mode decoding). For codewords with BERs in auxiliary region 240, although both the on-the fly mode decoding and extended mode decoding fail, an auxiliary decoder (e.g., using soft data input) may be able to successfully decode the codewords (in retry mode decoding), Each of the decoding regions (e.g., shown in FIG. 2) may help to define the type of primary and/or auxiliary decoder to be used in a decoder system, (e.g., the system shown in FIG. 1).

The decoding regions (and/or the primary and auxiliary decoders used) may be defined so that the cumulative probability (based on the area under curve 210) of BERs of codewords being in on-the-fly decoding region 220 may be greater than of the BERs being in transition decoding region 230. In addition, the cumulative probability (based on the area under curve 210) of BERs of codewords being in transition decoding region 230 may be greater than of the BERs being in auxiliary decoding region 240. This means that the decoder system (e.g., the system shown in FIG. 1) is designed in such a way as to have a higher probability of the primary decoder successfully decoding a stored codeword than the probability of the primary decoder failing to decode the stored codeword, thereby relying on the auxiliary decoder to decode the codeword. Because of this, the chances that auxiliary decoder will be activated and/or used to decode the codewords may be reduced. Therefore, the decoder system is designed to allow codewords to be decoded at a substantially high rate.

Figure 3:
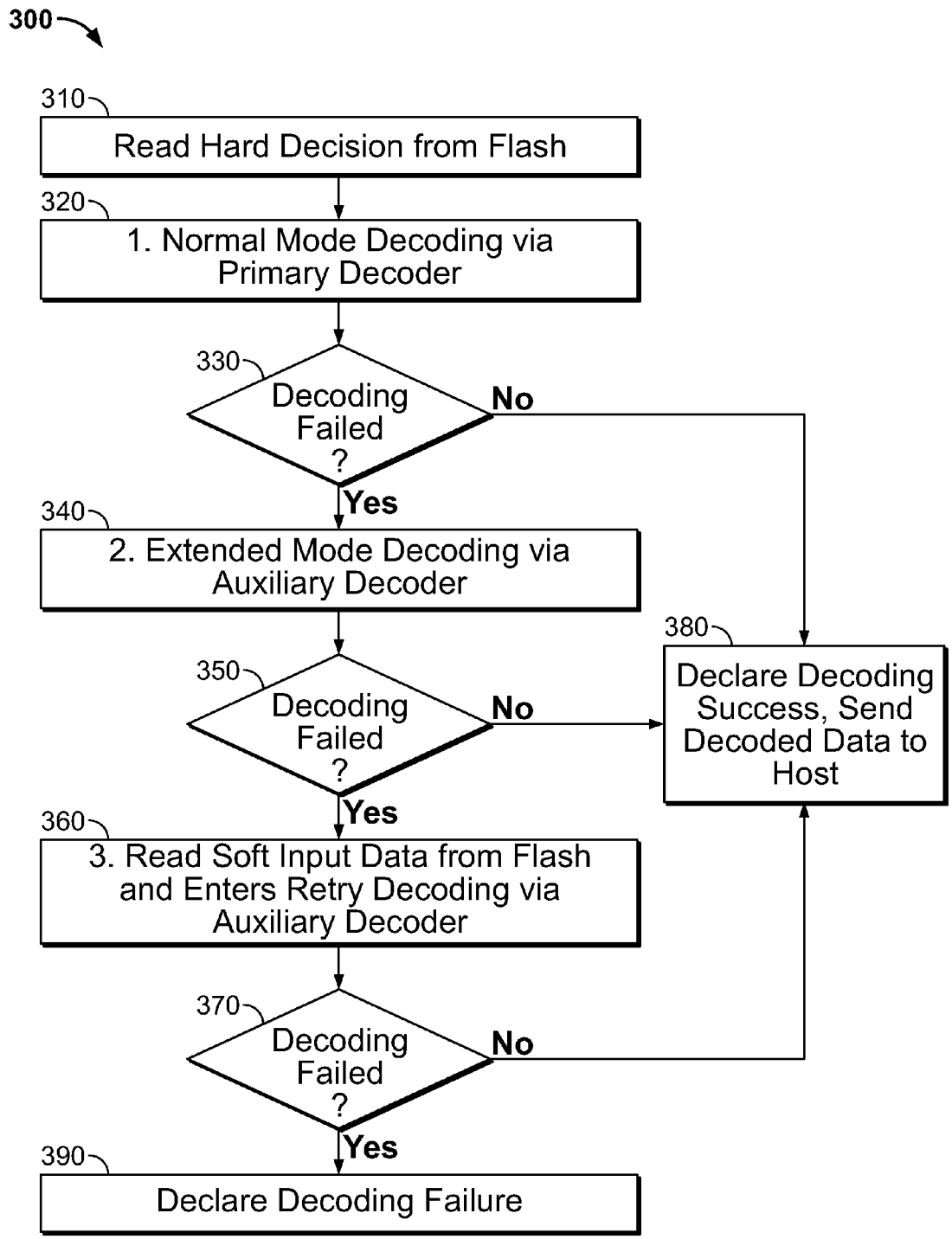
FIG. 3 shows an illustrative flow diagram of a process for decoding data using the decoders as described in the present disclosure, in accordance with some embodiments of the present disclosure.

FIG. 3 shows illustrative flow diagram of an process 300 for decoding data using the decoders as described herein, in accordance with some embodiments of the present disclosure.

At 310, hard data input (also referred to as hard decision input) pertaining to codeword (i.e., the symbols of a codeword) is read from a storage device. For example, the symbols of a codeword may be read from a storage location in storage device 110 of FIG. 1 and stored in input buffer 120 of FIG. 1.

At 320, a primary decoder (e.g., primary decoder 130 of FIG. 1) reads or receives the hard data (e.g., in 310) and attempts to decode the codeword associated with the hard data. For example, this attempt at decoding the codeword may be considered on-the-fly mode decoding, as discussed with reference to FIG. 2.

At 330, it may be decided (e.g., by the primary or auxiliary decoder, or a decoder controller) whether the primary decoder succeeded or failed at 320 in decoding the codeword. For example, decoder control top 135 of FIG. 1 may monitor primary decoder 130 of FIG. 1 to determine whether primary decoder 130 successfully decoded the codeword. As another example, primary decoder 130 of FIG. 1 may determine that decoding of the codeword failed and may report its failure to decoder control top 135 of FIG. 1. In some embodiments, the primary decoder may unsuccessfully attempt to decode the codeword several times before it is decided that the primary decoder failed to decode the codeword. If it is determined that, the primary decoder failed in decoding the codeword, operation 340 may be executed. If it is determined that the primary decoder succeeded in decoding the codeword, operation 380 may be executed.

At 340, an auxiliary decoder (e.g., auxiliary decoder 140 of FIG. 1) may be activated. The auxiliary decoder may read or receive hard data (e.g., the hard data read at 310) and attempt to decode the codeword associated with the hard data. For example, this attempt at decoding the codeword may be considered extended mode decoding, as discussed with reference to FIG. 2.

At 350, it may be decided (e.g., by the primary or auxiliary decoder, or a decoder controller) whether the auxiliary decoder succeeded or failed at 340 in decoding the codeword. For example, decoder control top 135 of FIG. 1 may monitor auxiliary decoder 140 of FIG. 1 to determine whether auxiliary decoder 140 successfully decoded the codeword. As another example, auxiliary decoder 140 of FIG. 1 may determine that decoding of the codeword failed and may report its failure to decoder control top 135 of FIG. 1. In some embodiments, the auxiliary decoder may unsuccessfully attempt to decode the codeword several times before it is decided that the auxiliary decoder failed to decode the codeword. If it is determined that the auxiliary decoder failed in decoding the codeword, operation 360 may be executed. If it is determined that the auxiliary decoder succeeded in decoding the codeword, operation 380 may be executed.

At 360, the auxiliary decoder (e.g., auxiliary decoder 140 of FIG. 1) may be active. The auxiliary decoder may read or receive soft data (e.g., the soft data pertaining to the codeword from operation 310). For example, auxiliary decoder 140 of FIG. 1 may retrieve additional soft data input associated with the stored codeword from storage device 110 of FIG. 1. As another example, decoder control top 135 of FIG. 1 may initiate a read operation from storage device 110 to read soft data associated with the codeword and provide decoder 140 of FIG. 1 with that data. The retrieving or reading of soft data from the storage device may involve multiple passes of reading the information pertaining to codeword(s) stored in the storage device. The auxiliary decoder may attempt to decode the codeword associated with the soft data read or received. For example, this attempt at decoding the codeword may be considered retry mode decoding, as discussed with reference to FIG. 2.

At 370, it may be decided (e.g., by the primary or auxiliary decoder, or a decoder controller) whether the auxiliary decoder succeeded or failed at 360 in decoding the codeword. For example, decoder control top 135 of FIG. 1 may monitor auxiliary decoder 140 of FIG. 1 to determine whether auxiliary decoder 140 successfully decoded the codeword. As another example, auxiliary decoder 140 of FIG. 1 may determine that decoding of the codeword failed and may report its failure to decoder control top 135 of FIG. 1. In some embodiments, the auxiliary decoder may unsuccessfully attempt to decode the codeword several times before it is decided that the auxiliary decoder failed to decode the codeword. If it is determined that the auxiliary decoder failed in decoding the codeword, operation 390 may be executed. If it is determined that the auxiliary decoder succeeded in decoding the codeword, operation 380 may be executed.

At 380, the decoding system, which includes the primary and auxiliary decoders and possibly a decoder control top, declares a success in decoding the codeword. The decoded data may then be output, to the system hosting the decoding system. For example, the decoded data may be output to buffer 150 of FIG. 1 by the decoder that successfully decodes the data. Process 300 may then be repeated for another codeword or exited.

At 390, the decoding system declares a failure in decoding the codeword. Process 300 may then be repeated for another codeword or exited.

It should be understood that the above operations of process 300 may be executed or performed in any order or sequence not limited to the order and sequence shown and described in the figure. Also, some of the above operations of process 300 may be executed or performed substantially simultaneously where appropriate or in parallel to reduce latency and processing times. In addition, some or all of the above operations of process 300 may be executed by low-power circuitry and/or by monitoring or control circuitry used by a decoder. For example, operations 320 and 330 may be skipped and operation 340 may be executed immediately after operation 310 in process 300, This may be done if the decoder control top, primary decoder, or auxiliary decoder has knowledge that the primary decoder will fail to decode the codeword selected at operation 310 with a substantially high probability. As another example, operations 320, 330, 340, and 350 may be skipped and operation 360 may be executed immediately after operation 310 in process 300. This may be done if the decoder control top, primary decoder, or auxiliary decoder has knowledge that the codeword selected at operation 310 has a substantially low SNR or a substantially high BER.

Figure 4:
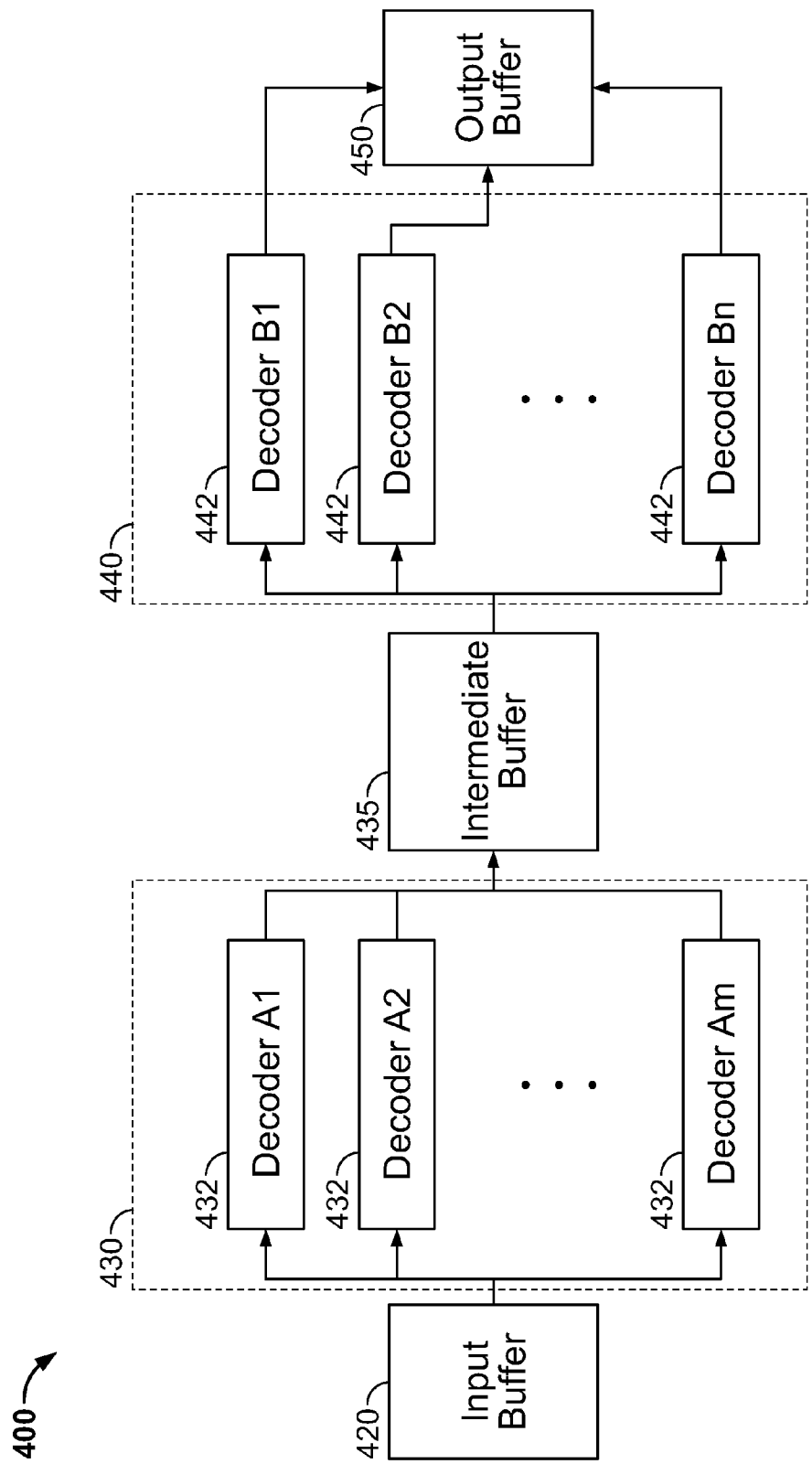
FIG. 4 shows an illustrative decoder system in accordance with some embodiments of the present, disclosure.

FIG. 4 shows illustrative system 400 in accordance with some embodiments of the present disclosure, system 400 is similar to system 100 shown in FIG. 1. System 400 includes input buffer 420, primary decoder circuitry 430, intermediate buffer circuitry 435, auxiliary decoder circuitry 440, and output buffer 450. Input buffer 420 may be substantially similar in design and in operation to input buffer 120 of FIG. 1. In some embodiments, primary decoder 430 and auxiliary decoder 440 may operate in the place of primary decoder 130 of FIG. 1 and auxiliary decoder 140 of FIG. 1, respectively. In some embodiments, primary decoder 430 and auxiliary decoder 440 may operate using the techniques described in process 300 of FIG. 3.

Primary decoder 430 may include a number, m, where m is a positive integer, of decoder circuitries 432 operating in parallel or in concatenation. Each of the decoders 432 within primary decoder 430 may read a codeword stored in input buffer 420. Each of decoders 432 may be a decoder that decodes the codeword in a very efficient manner. In particular, decoders 432 of primary decoder 430 may use a smaller amount of power compared to decoders 442 within auxiliary decoder 440, may use fewer iterations to decode a codeword compared to decoders 442 within auxiliary decoder 440, and may be of a lower complexity than decoders 442 within auxiliary decoder 440. Although primary decoder 430 and/or decoders 432 may have lower error correction power than auxiliary decoder 440 and/or decoders 442, the primary decoder and/or the decoders within, may have a higher throughput (e.g., 25.6 Gbps) and take up a lesser amount of silicon area than the auxiliary decoder and/or the decoders within.

In some embodiments, any one of decoders 432 included in primary decoder 430 may be any one of a Viterbi decoder, an LDPC decoder, an AN decoder, a BCH decoder, constant-weight decoder, convolutional decoder, or any other type of decoder of encoded information that makes use of hard data or soft data. In some implementations, each of decoders 432 may be configured to retrieve, from a storage device that stores codewords, additional soft data input associated with the stored codewords (e.g., when the particular decoder of decoders 432 is a decoder that uses soft data rather than hard data). Although not shown, in some embodiments, if any decoder 432 succeeds in decoding the codeword it receives from input buffer 420, that decoder may output the decoded data directly to output buffer 450. Output buffer 450 may be substantially similar to output buffer 150 of FIG. 1 and may be a temporary storage location in which a decoded data set is stored for consumption by utilization circuitry (e.g., a processor or control circuitry). In some embodiments, if any decoder 432 succeeds in decoding the codeword it receives from input buffer 420, that decoder may output the decoded data to intermediate buffer 435. If decoders 432 fail to decode a codeword, that codeword may be output to intermediate buffer 435. Intermediate buffer 435 may be a temporary storage location in which a successfully decoded data set is stored for consumption. Intermediate buffer 435 may also be a temporary storage location in which codewords that were not successfully decoded by decoders 432 are stored for later processing by decoders 442 within auxiliary decoder 440.

Auxiliary decoder 440 may be activated if primary decoder 430 fails to decode a codeword. Auxiliary decoder 440 may include a number, n, where n is a positive integer, of decoder circuitries 442 operating in parallel or in concatenation. Each of the decoders 442, within auxiliary decoder 440, may read a codeword stored in intermediate buffer 420. The codeword may be one that was not successfully decoded by decoders 432 within primary decoder 430. Each of decoders 442, within auxiliary decoder 440, may be a decoder that decodes the codeword using a more powerful and more complex decoding technique (e.g., with more iterations compared to the decoders within primary decoder 430, using more power compared to decoders within primary decoder 430, etc.). In particular, decoders 442 within auxiliary decoder 440 may use a larger amount of power compared to decoders 432 within primary decoder 430, may use more iterations to decode a codeword compared to decoders 432 within primary decoder 430, and may be of a greater complexity than decoders 432 within primary decoder 130. Although auxiliary decoder 440 may have increased error correction power than primary decoder 430, the auxiliary decoder may have a lower throughput (e.g., 800 Mbps) and take up a greater amount of silicon area than primary decoder 430.

In some embodiments, any of decoders 442, within auxiliary decoder 440, may be a Viterbi decoder, an LDPC decoder, an AN decoder, a BCH decoder, constant-weight decoder, convolutional decoder, or any other type of decoder of encoded information that makes use of hard data or soft data. In some implementations, each of decoders 442 may be configured to retrieve, from a storage device that stores codewords, additional soft data input associated with the stored codewords (e.g., when the particular decoder of decoders 442 is a decoder that uses soft data rather than hard data). In some embodiments, if any of decoders 442 succeeds in decoding the codeword it receives from intermediate buffer 435, that decoder may output, the decoded data to output buffer 450. Output buffer 450 may be substantially similar to output buffer 150 of FIG. 1 and may be a temporary storage location in which a decoded data set is stored for consumption by utilization circuitry (e.g., a processor or control circuitry).

Figure 5:
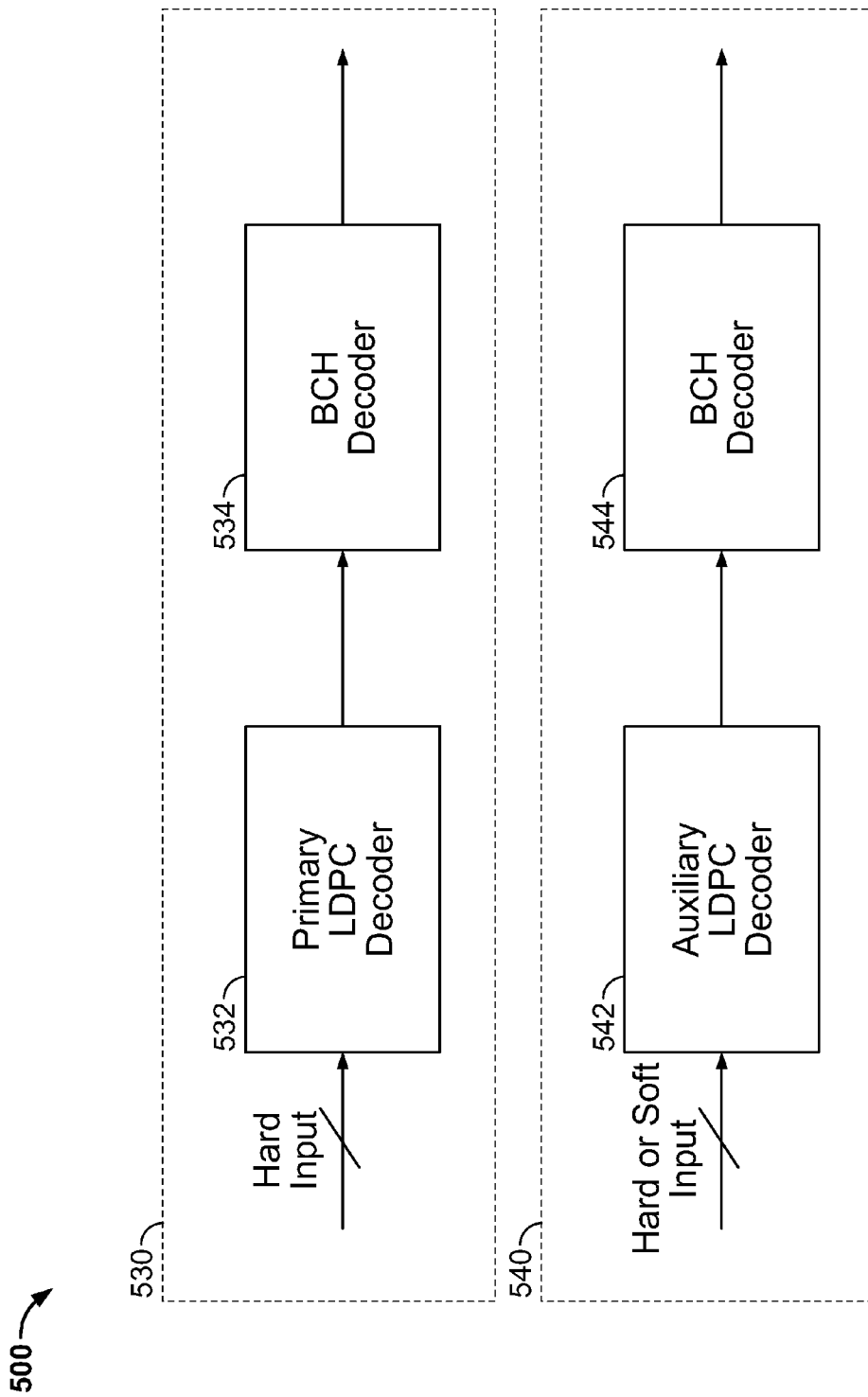
FIG. 5 shows illustrative primary and auxiliary decoders in accordance with some embodiments of the present disclosure.

FIG. 5 shows illustrative primary decoder 530 and auxiliary decoder 540 in accordance with some embodiments of the present disclosure. Primary decoder 530 may be substantially similar in operation to primary decoder 130 of FIG. 1 or primary decoder 430 of FIG. 4. Auxiliary decoder 540 may be substantially similar in operation to primary decoder 140 of FIG. 1 or primary decoder 440 of FIG. 4. Primary decoder 530 may be used in place of primary decoder 130 in the system shown in FIG. 1 or primary decoder 430 in the system shown in FIG. 4. Auxiliary decoder 540 may be used in place of auxiliary decoder 140 in the system shown in FIG. 1 or auxiliary decoder 440 in the system shown in FIG. 4, In some embodiments, primary decoder 530 and auxiliary decoder 540 may operate using the techniques described in process 300 of FIG. 3.

Primary decoder 530 and auxiliary decoder 540 may be used in applications involving storage devices that store information encoded using LDPC codes concatenated with BCH codes. Primary decoder 530 may include LDPC soft, iterative decoder 532 connected in series with BCH decoder 534. Auxiliary decoder 540 may include LDPC soft iterative decoder 542 connected in series with BCH decoder 544. Primary decoder 530 and auxiliary decoder 540 may instead each include any number and any type of decoders connected in series. In operation, primary decoder 530 may use hard data associated with a codeword as input. The input to primary decoder 530 may first, be processed by decoder 532 before being processed by decoder 534. If it successfully decodes the codeword, primary decoder 530 may output the decoded data. If primary decoder 530 is unsuccessful at decoding the codeword, auxiliary decoder 540 may be activated. Auxiliary decoder 540 may use hard data and/or soft data (that it reads or receives) associated with the codeword as input. The input to auxiliary decoder 540 may first be processed by decoder 542 before being processed by decoder 544. If it successfully decodes the codeword, auxiliary decoder 540 may output the decoded data. If auxiliary decoder 540 is unsuccessful at decoding the codeword, it may declare that it failed to decode the codeword.

It should be understood that, the embodiments of the primary and auxiliary decoders (e.g., primary decoder 130 of FIG. 1, 430 of FIG. 4, or 530 of FIG. 5 and auxiliary decoders 140 of FIG. 1, 440 of FIG. 4, or 540 of FIG. 5) described herein might be practiced by other than the embodiments described herein. For example, each primary and auxiliary decoder may snare components in their implementation. A primary and an auxiliary decoder may be implemented using the same type of circuitry, but may be operated in different modes. For example, the primary decoder (e.g., primary decoder 130, 430, or 530) may be one or more LDPC soft, iterative decoders each operating at three decoding iterations per codeword and the auxiliary decoder (e.g., auxiliary decoders 140, 440, or 540) may be one or more LDPC soft iterative decoders each operating at ten iterations per codeword. As another example, data may have been encoded and stored in a storage device using LDPC encoding with codes that have a rate of 0.9. In this example, a decoder system may include one or more LDPC soft iterative primary decoders operating at two decoding iterations per codeword, with a throughput of 25.6 Gbps and one or more LDPC soft iterative auxiliary decoders operating at eight iterations per codeword, with a throughput of 6.4 Gbps.

It should further be understood that the auxiliary decoder may be activated and used when the primary decoder fails to decode the codeword or in instances where it is known that the codeword has a poor BER or SNR. In addition, the reading of soft data (e.g., from the storage device) for use in decoding a codeword (e.g., by an auxiliary decoder) may occur when it is needed thereby eliminating unnecessary read operations. Such unnecessary read operations could lower system throughput, increase power consumption, and cause read disturbances to the storage device. Due to the probability distribution of the BERs of codewords stored in a storage device (i.e. curve 210 of FIG. 2), most codewords will be decoded using a primary decoder, with hard data being input to the decoder.

Because of this, and because the primary decoder has a substantially high throughput and a substantially low power consumption compared to the auxiliary decoder, the decoding of data using the decoding systems described herein will be done with a substantially high throughput and substantially low power consumption.

It should also be understood that the primary decoders described herein may be of a lower complexity than the auxiliary decoders described herein for a similar throughput. As discussed above, the probability of the primary decoder decoding a stored codeword is higher than the probability of the primary decoder failing to decode the codeword and requiring the auxiliary decoder to decode the codeword. Moreover, because the auxiliary decoder may be used substantially less frequently than the primary decoder, the throughput requirements of the auxiliary decoder may be significantly less than that for the primary decoder. Because of this, a high throughput is maintained for the overall decoding system. This may also help to significantly reduce the silicon area occupied by the auxiliary decoder. The decoder system, which includes both the primary and the auxiliary decoder and possibly decoder control circuitry, may have a similar performance as a full-blown soft iterative decoder, while providing a high throughput, and keeping to a minimum power consumption and silicon area occupancy.

The foregoing describes systems and methods for decoding data with a decoder system that includes both a primary and an auxiliary decoder. Those skilled in the art will appreciate that the described embodiments of the present disclosure may be practiced by other than the described embodiments, which are presented for the purposes of illustration rather than of limitation.

Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA), both of which may include additional communication circuitry (e.g., radio-frequency circuitry). Alternatively, the present disclosure may also be implemented in software running on any suitable hardware processor. Accordingly, equivalents may be employed and substitutions made, where appropriate, by those skilled in the art herein without departing from the scope of the present disclosure as recited in the claims that follow.

What is claimed is:

1. A method for decoding a codeword stored in a storage device, using a decoder system, the method comprising:
   receiving the codeword from the storage device;
   selectively attempting to decode the codeword using a primary decoder of the decoder system based on a probability of failing to decode the codeword;
   receiving an indication that the primary decoder failed to decode the codeword; and
   decoding the codeword using an auxiliary decoder of the decoder system based on the received indication, wherein the primary decoder is of a lower complexity than the auxiliary decoder.

2. The method of claim 1, wherein the primary decoder has a higher throughput for decoding codewords than the auxiliary decoder.

3. The method of claim 1, wherein the primary decoder consumes less power than the auxiliary decoder.

4. The method of claim 1, wherein the primary decoder comprises a low density parity check (LDPC) code decoder operating in series with a BCH code decoder.

5. The method of claim 1, wherein the auxiliary decoder comprises a low density parity check (LDPC) code decoder in operating in series with a BCH code decoder.

6. The method of claim 1, wherein the codeword is encoded with a low density parity check (LDPC) code concatenated with a BCH code.

7. The method of claim 1, wherein the primary decoder accepts hard data associated with the codeword as input and the auxiliary decoder accepts soft data associated with the codeword as input.

8. The method of claim 1, further comprising activating the auxiliary decoder in response to receiving the indication that primary decoder failed to decode the codeword.

9. The method of claim 1, wherein the primary decoder is configured to have a higher probability of decoding the codeword than the probability of failing to decode the codeword.

10. The method of claim 1, wherein the primary and the auxiliary decoders each comprises a low density parity check (LDPC) code decoder, and wherein the primary decoder performs fewer iterations per codeword than the auxiliary decoder.

11. A decoder system for decoding a codeword stored in a storage device, the system comprising:
    a primary decoder configured to selectively attempt to decode the codeword based on a probability of failing to decode the codeword;
    a decoder controller configured to receive an indication that the primary decoder failed to decode the codeword; and
    an auxiliary decoder configured to decode the codeword based on the indication, wherein the primary decoder is of a lower complexity than the auxiliary decoder.

12. The system of claim 11, wherein the primary decoder takes up less silicon area than the auxiliary decoder.

13. The system of claim 11, wherein the primary decoder comprises a plurality of decoders.

14. The system of claim 13, wherein the plurality of decoders, included in the primary decoder, operate in parallel.

15. The system of claim 13, wherein the auxiliary decoder comprises a plurality of decoders operating in parallel.

16. The system of claim 15, where the plurality of decoders, included in the auxiliary decoder, operate in parallel.

17. The system of claim 11, wherein the primary decoder accepts hard data associated with the codeword as input and the auxiliary decoder accepts soft data associated with the codeword as input.

18. The system of claim 11, wherein the decoder controller is configured to activate the auxiliary decoder in response to the indication.

19. The system of claim 11, wherein the primary decoder is designed to have a higher probability of decoding the codeword than the probability of failing to decode the codeword.

20. The system of claim 11, wherein the primary decoder is coupled to the auxiliary decoder and each of the primary decoder and the auxiliary decoder are coupled to the decoder controller.

* * * * *